United States Patent [19]
Li et al.

[11] Patent Number: 6,063,196
[45] Date of Patent: May 16, 2000

[54] SEMICONDUCTOR PROCESSING CHAMBER CALIBRATION TOOL

[75] Inventors: Shih-Hung Li; Timothy Green, both of Sunnyvale, Calif.

[73] Assignee: Applied Materials, Inc., Santa Clara, Calif.

[21] Appl. No.: 09/183,484

[22] Filed: Oct. 30, 1998

[51] Int. Cl.[7] .................................................. C23C 16/00
[52] U.S. Cl. ........................... 118/712; 118/715; 118/728
[58] Field of Search .................................. 118/715, 708, 118/712, 728

[56] References Cited

U.S. PATENT DOCUMENTS

4,951,601  8/1990  Maydan ................................. 118/719
5,000,113  3/1991  Wang ..................................... 118/725

*Primary Examiner*—Richard Bueker
*Attorney, Agent, or Firm*—Blakely Sokoloff Taylor & Zafman

[57] ABSTRACT

An apparatus and method for aligning various components of a semiconductor processing system is disclosed. A calibration tool positioned on the main body of the processing chamber is used to align the coordinates of the susceptor, wafer lifting pins, susceptor shaft, wafer handling blade and the rotational axis of the susceptor with that of the main body. By aligning the various components to a common coordinate system, it is possible to more precisely control the angular orientation of a wafer being processed with that of the processing gas flow.

8 Claims, 8 Drawing Sheets

SEMICONDUCTOR PROCESSING CHAMBER CALIBRATION TOOL

FIELD OF THE INVENTION

The present invention relates generally to semiconductor processing and particularly to a tool for calibrating the position and alignment of the semiconductor processing chamber components.

BACKGROUND OF THE INVENTION

Deposition of a film on the surface of a semiconductor wafer is a common step in semiconductor processing. The process of depositing layers on a semiconductor wafer (or substrate) usually involves placing the substrate within a processing chamber and holding the wafer within a stream of a reactant gas flowing across the surface of a wafer. Usually, heat is applied to drive the chemical reaction of the gases in the chamber and to heat the surface of the wafer on which the film is deposited. The processing chamber is typically heated by external lamps which pass infra-red radiation into the processing chamber through a quartz window that is transparent to the infra-red radiation.

Figure 1:
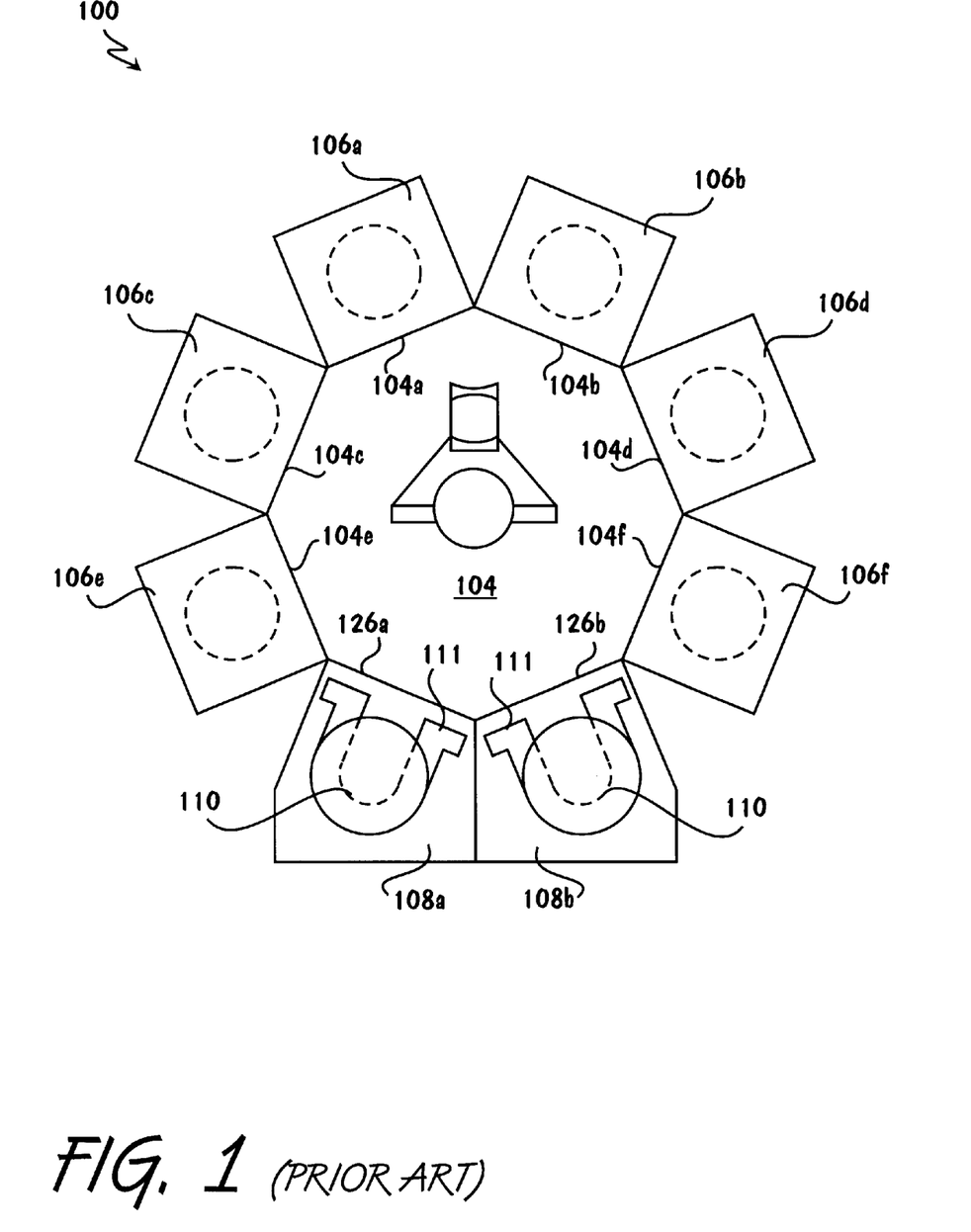
FIG. 1 is a top view of a multiple chamber semiconductor processing unit.

Referring now to FIG. 1, there is shown a multiple-chamber integrated process system 100 including an enclosed main frame or housing 102 having sidewalls that define an enclosed vacuum transfer chamber 104.

A number of individual processing chambers 106a–f are mounted one each on an associated sidewall of the transfer chamber 104. Two load lock cassette elevators 108a and 108b are adapted for vertically stacking a multiplicity of cassettes which in turn hold wafers 110 horizontally. The load lock cassette elevator assemblies 108a and 108b selectively position each cassette directly opposite and aligned with a transfer chamber entrance slit or opening 112a and 112b, respectively. Each cassette holds multiple wafers. Wafers 110 are held within the cassette by a set of support structures 111 having a diameter that is slightly larger than the diameter of the wafers being housed.

Processing chambers 106a–f and the associated main frame side walls also have communicating slits 114a–f, respectively, which are similar to the load lock entrance slits 112a and 112b. Doors or slit valves (not shown) are provided for sealing the access slits.

A robotic wafer transfer system 120 is mounted within transfer chamber 104 for transferring wafers 110 between load locks 108a and 108b and the individual processing chambers 106a–f. Robot assembly 120 includes a blade 122 and a driver 121 that imparts both rotational and reciprocating movement to blade 122 for affecting the desired cassette-to-chamber, chamber-to-chamber and chamber-to-cassette wafer transfer. The reciprocating movement (straight line extension and retraction) is indicated by arrow 130, while the pivotal or rotational movement is indicated by arrow 140.

Figure 2:
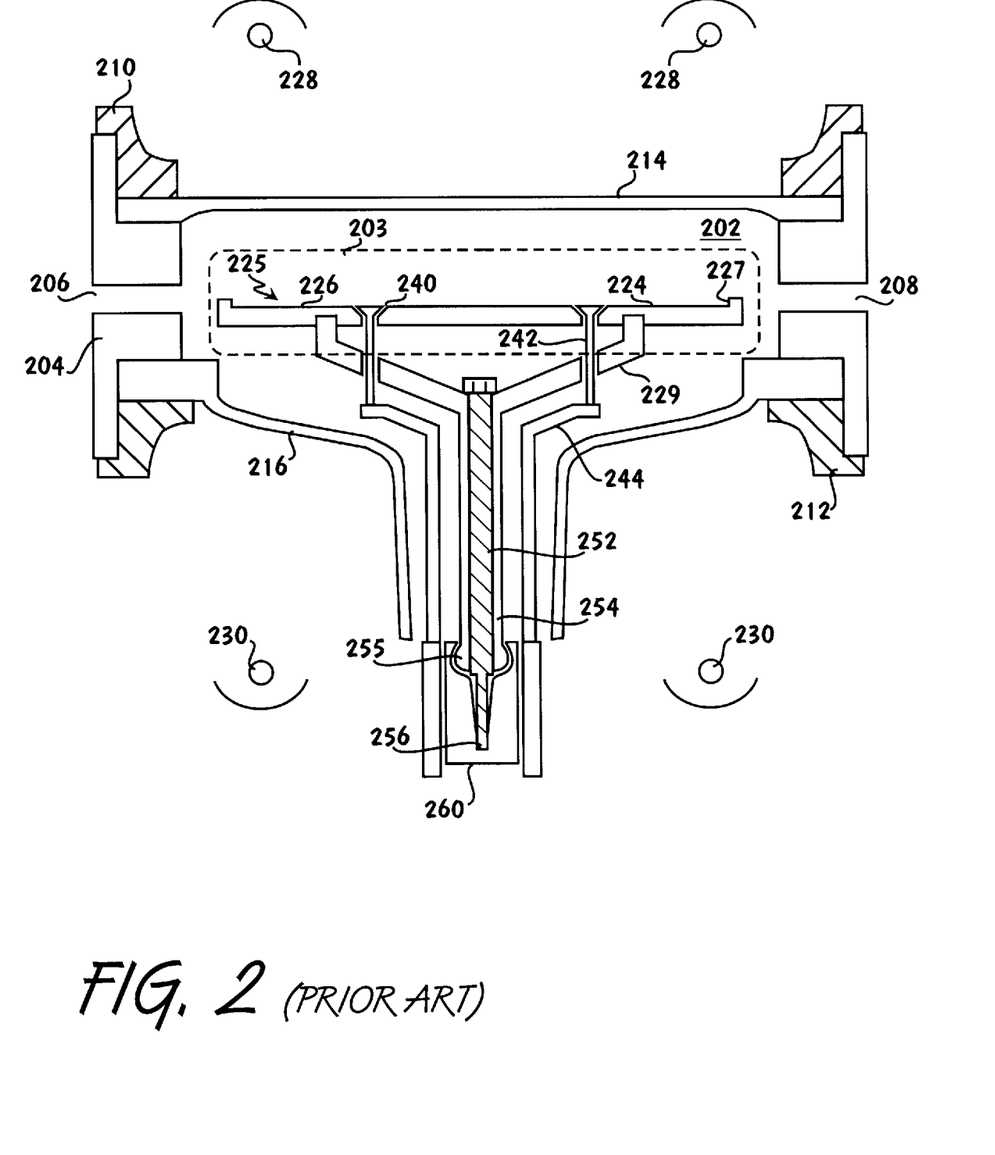
FIG. 2 is a cross-section side view of a semiconductor processing chamber shown in FIG. 1.

FIG. 2 illustrates a cross-sectional view of an exemplary semiconductor processing chamber, such as processing chamber 106a depicted in FIG. 1. Processing chamber 106a includes an inner chamber 202 for facilitating the flow of a process gas over the surface of a wafer. The housing includes a main body 204 having a gas inlet port 206 and a gas exhaust port 208. An upper clamp ring 210 and a lower clamp ring 212 act to hold a quartz cover member 214 and a quartz lower member 216 in place, respectively. Process gas is injected into chamber 202 through gas inlet port 206 which is connected to a gas source. Residual process gas and various waste products are continuously removed from the interior of chamber 202 through exhaust port 208.

Wafers are placed into and removed from chamber 202 by the robotic wafer handling system 120 through an opening 203 formed in the side wall of the chamber.

A susceptor 224 holds the wafer in position during the semiconductor layer deposition process. As shown in FIG. 2, susceptor 224 includes a pocket 225 that is defined by at least one annular or planar bottom surface 226 and a cylindrical side wall 227. The depth of pocket 225 is generally chosen so that the top surface of the wafer being processed is approximately level with the top surface of the susceptor. Susceptor support 229 is coupled to susceptor 224 for rotating the wafer during the semiconductor fabrication process. A pin 250 having a keyed distal end extends through a center opening 252 in the susceptor support shaft 254. The keyed distal end of the pin 250 rests within a chamfered slot 256 of a member 260. Member 260 is, in turn, coupled to a motor. Member 260 is rotatably coupled to a distal end 255 of shaft 254. The manner in which the distal end of shaft 234 is coupled to member 260 permits the shaft 254 to be rotated even when the rotational axis of the motor is different than the rotational axis of the shaft 254. Susceptor 224 also includes a plurality of through holes 240 for receiving at least three loading pins 242. Loading pins 242 are mounted to a support shaft 244 that provides vertical movement to raise and lower pins 242. Pins 242 are used to raise a wafer above susceptor surface 226 while the wafer is being loaded or unloaded into the chamber. Raising of the wafer permits the robot blade from scraping or otherwise damaging the susceptor surface during the wafer loading or unloading procedure.

Heating lamps 228 and 230 provide infra-red radiant heat into the chamber through window portion 214 and quartz lower member 216 which are transparent to infra-red radiation.

In deposition processes, it is desirable to maximize wafer throughput while depositing film layers that have uniform thickness. With the increasing miniaturization of electronic circuits, there is a need to more accurately control the thickness of the deposition layers during semiconductor wafer processing. Among other requirements, in order to obtain uniform deposition layer thickness, it is important that the angular orientation of the wafer with that of the gas flow be essentially equal at all points along the wafer surface during the deposition process. It is also important that the wafer be properly positioned on the susceptor by the wafer blade 122.

Currently, the processing chamber components are aligned by visual inspection. Thus, what is needed is a method and an apparatus for accurately aligning the various chamber components and the blade of the wafer handling system.

SUMMARY OF THE INVENTION

An apparatus and method for aligning the components of a semiconductor processing system is disclosed. A calibration tool positioned on the main body of the processing chamber is used to align the coordinates of the susceptor, wafer lifting pins, susceptor shaft, wafer handling blade and the rotational axis of the susceptor with that of the main body. By aligning the various components to a common coordinate system, it is possible to more precisely control the angular orientation of a wafer being processed with that of the processing, gas flow.

In accordance with one embodiment, the calibration tool includes a circular body having an upper surface and a lower surface. Three protuberances, spaced 120 degrees apart, extend from the lower surface. The distal end points of the protuberances define an x-y plane. The calibration tool is supported on the processing chamber main body by the three protuberances. As such, the x-y axis of the calibration tool is aligned with the x-y axis of the main body of the processing chamber. The calibration tool also includes three spring loaded post that are spaced 120 degrees apart. The spring loaded posts extend radially outward from the circumference of the substrate to act upon a vertical wall section of the processing chamber main body. The spring loaded posts act to center the z axis of the calibration tool with the z axis of the processing chamber's main body.

One or more through openings are provided within the calibration tool body for receiving measuring devices that are used to measure differences between either of the x, y and z coordinates of the processing chamber main body and the various chamber components.

BRIEF DESCRIPTION OF THE DRAWINGS:

The invention is further described by way of example with reference to the accompanying drawings wherein.

DETAILED DESCRIPTION

A calibration tool for aligning the components of a semiconductor processing chamber is described. In the following description, numerous specific details are set forth such as material types, dimensions, processing steps, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention.

As previously discussed, in order to obtain uniform deposition layer thicknesses across the surface of a wafer, it is important that the angular orientation of the wafer with that of the gas flow be essentially equal at all points along the wafer surface during wafer processing. The need to more accurately maintain the proper angular orientation of the wafer has become increasingly more important with the increasing miniaturization of electronic circuits and the larger sized wafers being processed. In accordance with the present invention, a calibration tool is positioned and aligned with the xyz coordinates of the main body of a semiconductor processing chamber. Holes in the calibration tool are then used to align various processing system components with the coordinates of the main body. By aligning the various components to a common coordinate system, it is possible to more precisely control the angular orientation of the a wafer being processed with that of the processing gas flow.

Figure 3:
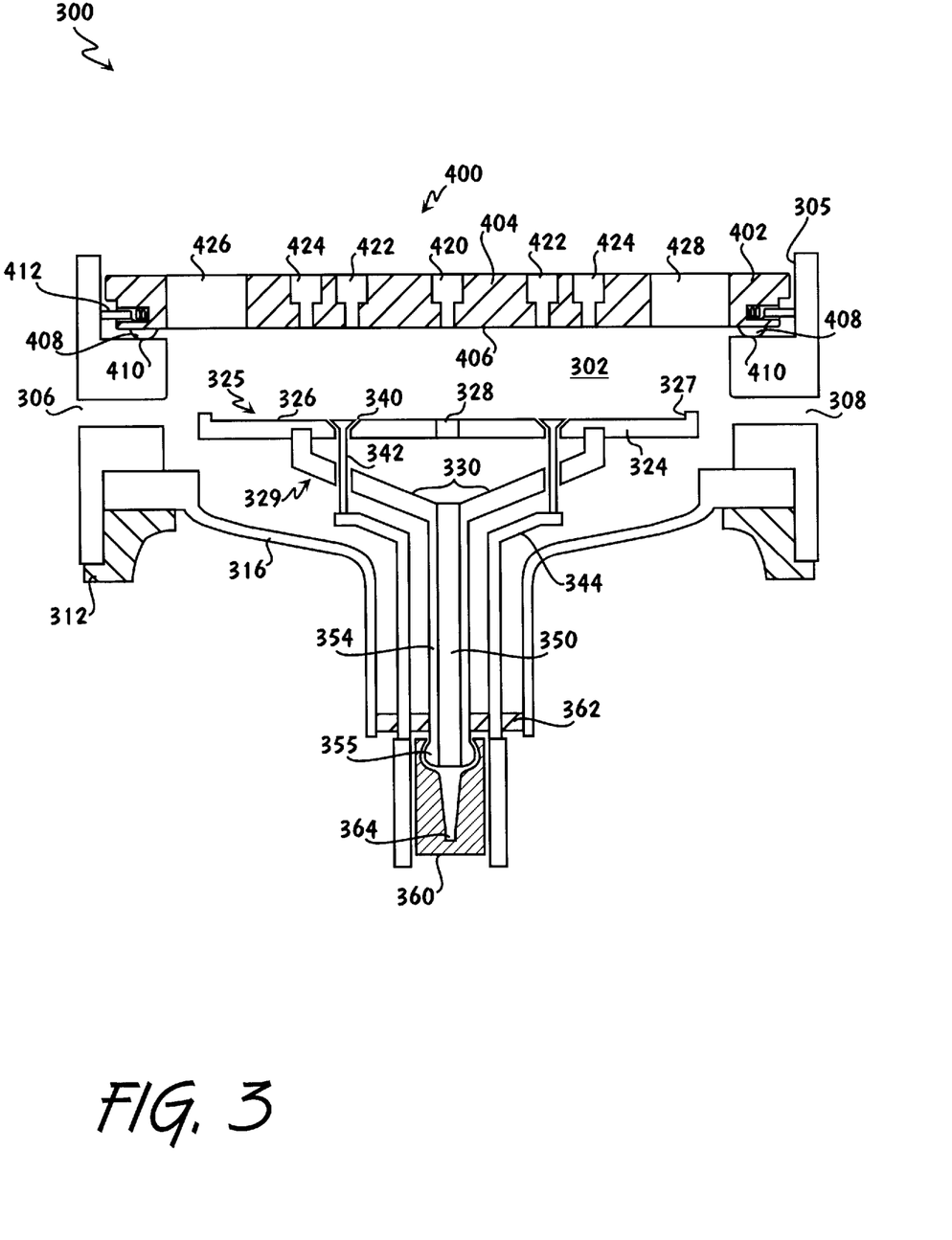
FIG. 3 is a cross-section side view of calibration tool positioned within a semiconductor processing chamber in one embodiment of the present invention.
Figure 4:
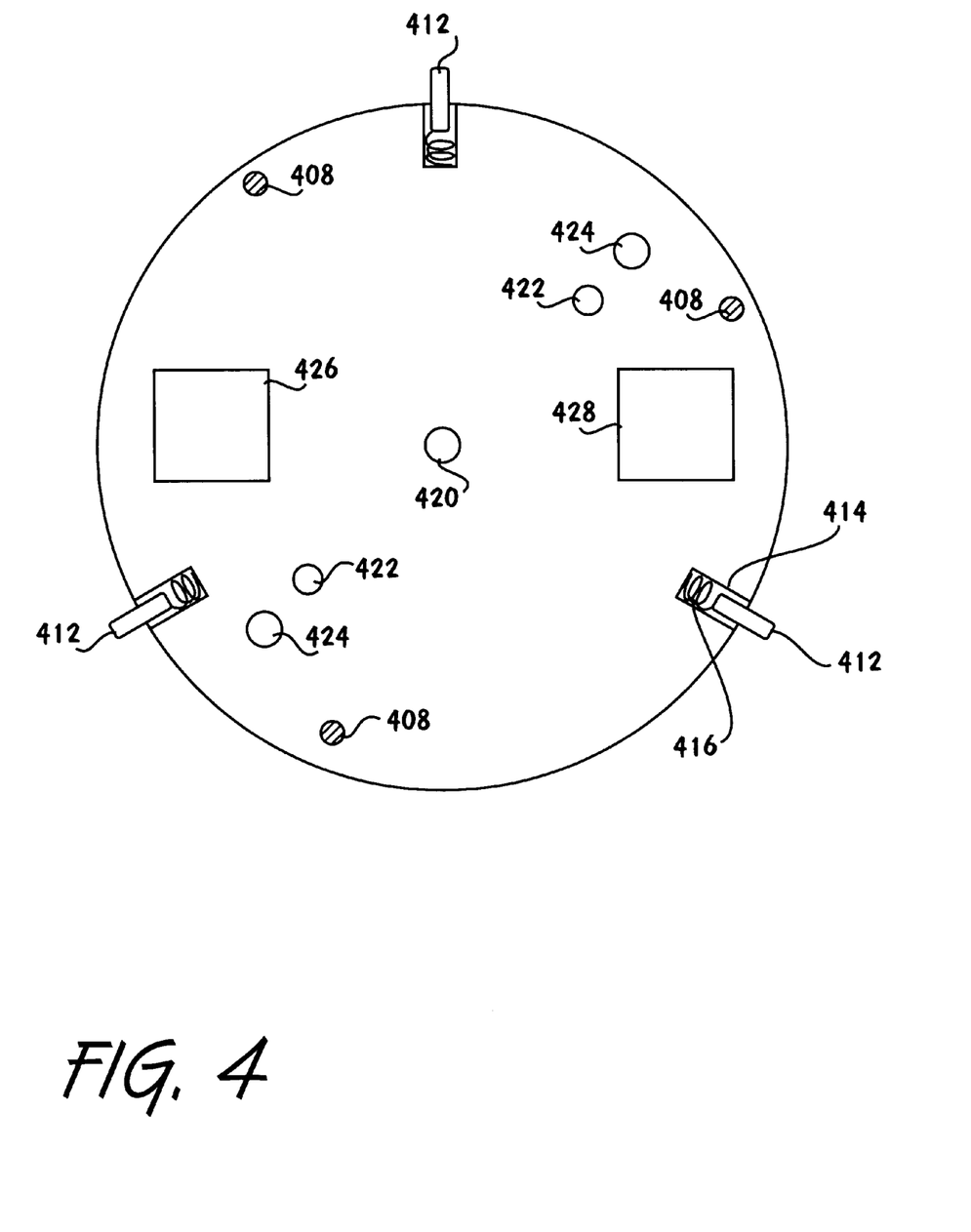
FIG. 4 is a top view of a calibration tool in one embodiment of the present invention.

FIG. 3 illustrates a semiconductor processing chamber 300 having a calibration tool 400 positioned and aligned with the main body 304 of the processing chamber. The main body 304 partially defines an inner chamber 302. FIG. 4 is a top view of the calibration tool 400. Processing chamber 300 includes a gas inlet port 306 and a gas exhaust port 308. During processing, a process gas is injected into chamber 302 through gas inlet port 306 which is connected to a gas source. Residual process gas and various waste products are removed from the interior of chamber 302 through exhaust port 308. During operation, processing chamber 300 includes an upper quartz window and an upper clamp ring that holds the upper window in position. In FIG. 3, the processing chamber 300 is shown with the upper quartz window and the upper clamp ring being removed. Processing chamber 330 also includes a lower quartz member 316 which is held in position by a lower clamp ring 312.

A susceptor 324 holds a wafer during the semiconductor layer deposition process. As shown in FIG. 3, susceptor 324 includes a pocket 325 that is defined by at least one annular or planar bottom surface 326 and a cylindrical side wall 327. The depth of pocket 325 is generally chosen so that the top surface of the wafer being processed is approximately level with the top surface of the susceptor. Susceptor 324 includes an alignment hole 328 that is concentric to the rotational axis of the susceptor. A susceptor support assembly 329 is coupled to susceptor 324 and rotates the susceptor 324 during the semiconductor fabrication process. Assembly 329 includes a plurality of arms 330 that are attached to a support shaft 354. Support shaft 354 includes a hollow bore 350 that extends through the length of the shaft. A distal end 355 of shaft 350 is swivelly coupled to a coupler 360 that links shaft 354 to a motor (not shown) which provides rotational movement to coupler 360. The manner in which the distal end of shaft 354 is coupled to coupler 360 enables shaft 354 to be rotated even when the rotational axis of the motor 370 is different than the rotational axis of the shaft 354. Shaft 354 is fixedly attached to the lower quartz member 316. A sealing device 362 establishes an air-tight seal at the shaft 354 and lower quartz window 316 interface. During operation, a pin (not shown) is positioned within the shaft through bore 352 and keyed within a chamfered slot 356 in member 360. The slot and key configuration causes shaft 354 to rotate when member 360 is rotated. When the rotational axis of shaft 354 and the rotational axis of the motor 370 are not properly aligned, that is, are not parallel the susceptor will rotate off center causing the susceptor to wobble as it is rotated. As a result, the angular orientation between the surface of a wafer residing within the susceptor pocket 325 and that of the process gas flow will vary during the deposition process.

Figure 5:
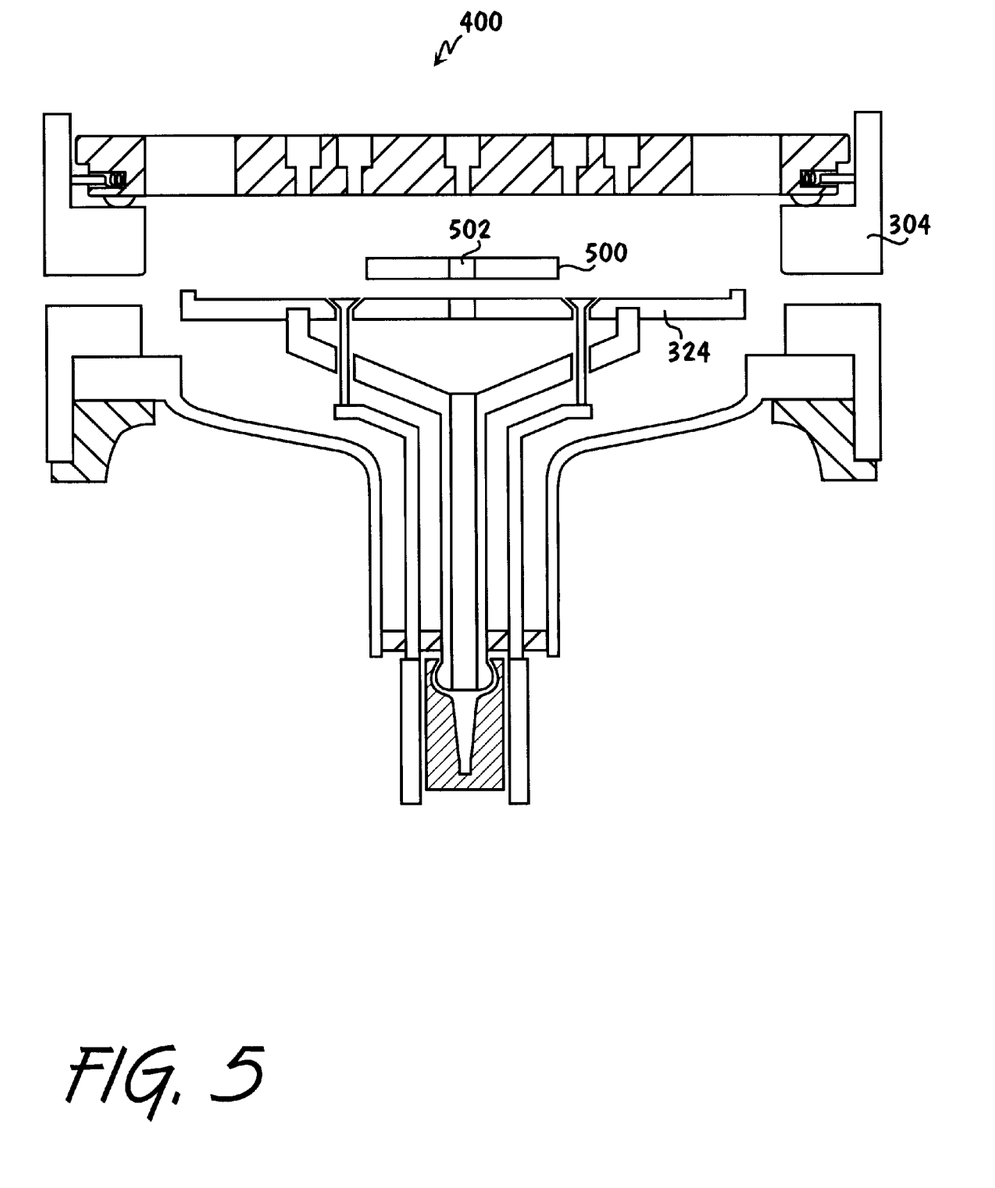
FIG. 5 is a cross-section side view of a wafer handling blade positioned within a semiconductor processing chamber in accordance with one embodiment of the present invention.

Susceptor 324 also includes a plurality of through holes 340 for receiving at least three loading pins 342. Loading pins 342 are mounted to a support shaft 344 that provides vertical movement to raise and lower pins 342. Typically, three pins 342 spaced 120 degrees apart are used to raise a wafer above susceptor surface 326 while the wafer is being loaded or unloaded into the chamber. Raising of the wafer permits a wafer handling blade from scraping or otherwise damaging the susceptor surface during the wafer loading or unloading procedure. In accordance with one embodiment of the present invention, as shown in FIG. 5, the wafer handling blade 500 of the process system also includes an alignment hole 502 which is typically located at the geometric center of wafer when positioned on the blade. The through bore 350 of shaft 354, alignment hole 328 and loading pin holes 340 of susceptor 324, and the alignment hole 502 of the wafer handling blade 500 are used in conjunction with the calibration tool 400 to align the respective components with the a common coordinate system.

In one embodiment, the calibration tool 400 includes a circular substrate 402 having an upper surface 404 and a lower surface 406. The substrate 402 is typically made of acrylic or other type of clear plastic. Three protuberances 408, spaced 120 degrees apart, extend from the lower surface 406. The distal end points 410 of the protuberances define an x-y plane. The calibration tool 400 is supported on the processing chamber main body 304 by the three protuberances 408. As such, the x-y axes of the calibration tool 400 are aligned with the x-y axes of the main body 304 of the processing chamber 300. The calibration tool 400 also includes three spring loaded post 412 that are positioned within recesses 414 along the circumference of substrate 402. Recesses 414 are spaced 120 degrees apart from one another. Springs 416 bias posts 412 radially outward from the circumference of the substrate 402 to act upon a vertical wall section 305 of the processing, chamber main body 304. The spring loaded posts 412 act to center the z axis of the calibration tool 400 with the z axis of the processing chamber's main body 304.

A plurality of through openings are provided within the calibration tool substrate 402 for receiving measuring devices that are used to measure differences between the x, y and z axes of the processing chamber main body and the various chamber components.

A center opening 420 that is concentrically aligned with the z axis of the main body 304 is provided within the calibration tool substrate. Through opening 420 has a shoulder 421 dividing the through opening into an upper aperture 420a and a lower aperture 420b. The shoulder 421 within opening 420 is planarized to within acceptable calibration tolerances and defines the x-y plane of calibration tool. The upper aperture has a larger diameter than the lower aperture and is sized to accommodate the insertion of a measuring device or alignment tool. In most instances, the measuring device or alignment tool rests on shoulder 421. Thus, in lieu of planarizing the entire upper surface 404 of the calibration tool to within a narrow tolerance range, it is only necessary to planarize the shoulder 421 of through opening 420.

In practice, an elongated alignment pin or other alignment device may be inserted into the through opening 420 of the calibration tool 400 and the alignment hole 328 of the susceptor 324 as a means of aligning the z axis of the susceptor with that of the calibration tool 400. By aligning the z axis of the susceptor with that of the calibration tool 400, the z axis of the susceptor is necessarily aligned with the z axis of the main body 304 of the processing chamber 300. Alignment tolerances may be varied by varying the diameter of openings 420 and 328 or by varying the diameter of the alignment pin.

Opening 420 may also be used to check the alignment of the rotational axis of the susceptor support shaft 354 and coupler 360. Alignment of the shaft 354 and coupler 360 is generally performed by inserting an elongated alignment rod through opening 420 and into the through bore 350 of shaft 354. When the rotational axis of shaft 354 and coupler 360 are properly aligned with the z axis of the calibration tool 400, the distal end of the alignment tool will rest within the chamfered slot 364 of coupler 360. Alignment of the shaft 354 and coupler 360 may be measured by length of the alignment rod extending above shoulder 421 of opening 420 or the top surface 404 of substrate 402.

With reference to FIG. 5, a wafer handling blade 500 is shown positioned within processing chamber 300. As previously discussed, blade 500 contains an alignment hole 502 that is used for aligning the center of blade 500 with the center of the susceptor 324. This is accomplished by first aligning the center alignment hole of the susceptor 324 with the center alignment opening 420 in the calibration tool substrate 402. The alignment hole 502 of the wafer handling blade 500 is then aligned with the center alignment opening 420 of the calibration tool. Alignment of the wafer handling blade is accomplished by inserting an alignment rod through opening 420 and adjusting the position and rotation of the blade until the alignment rod is appropriately oriented within the alignment hole 502 of blade 500.

Figure 6:
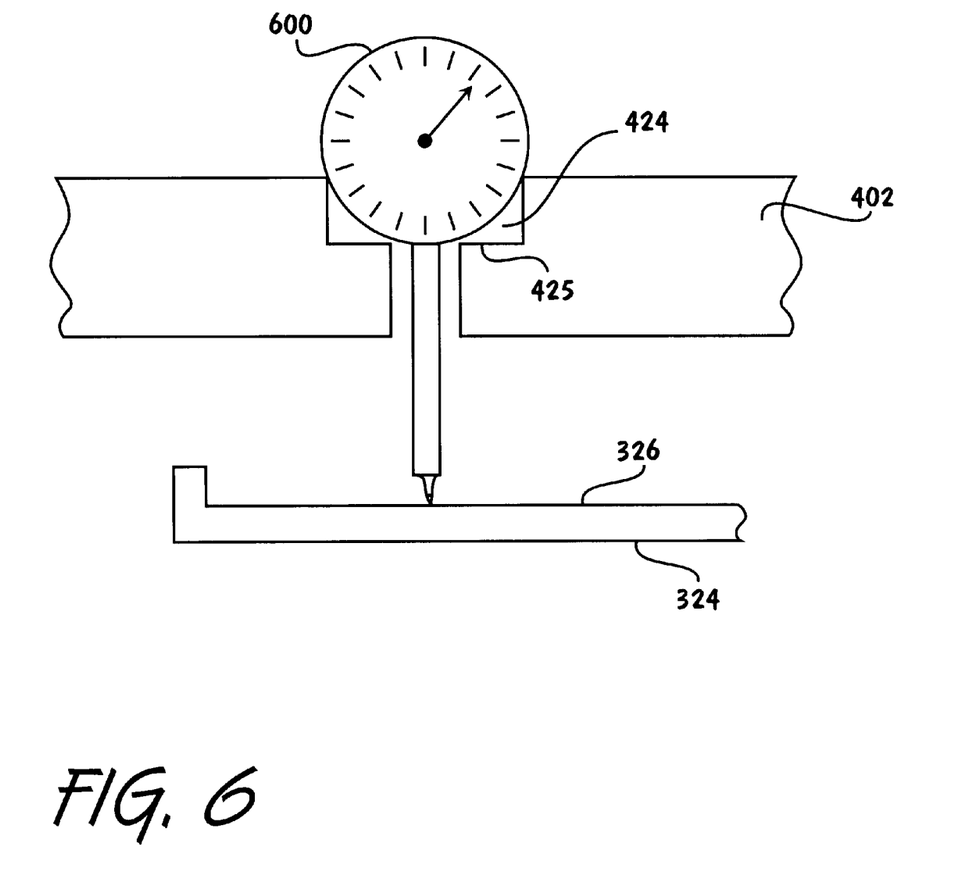
FIG. 6 illustrates a dial indicator positioned within an alignment through opening of a calibration tool of the present invention.

A second set of through openings 422 in the calibration tool substrate 402 are used to measure the alignment of the wafer loading pins 342. Each of through openings 422 has a shoulder 423 dividing the through opening into an upper aperture 422a and a lower aperture 422b. The shoulder 423 within opening 423 is planarized in the manner described above and defines the x-y plane of the calibration tool 400. It is important that the plane defined by the proximal end 341 of the loading pins 342 be essentially co-planar with the x-y plane of the calibration tool 400. Proper alignment of the pins 342 ensures that a wafer will not slide off the pins 342 after being placed on the pins by the wafer handling blade 500. The co-planarity of the x-y plane of pins 342 and the x-y plane of calibration tool 400 is measured by first positioning a dial indicator within at least one of through openings 422 such that the dial indicator rests on shoulder 423 and then measuring the vertical displacement at each loading pin 342 location. FIG. 6 illustrates the placement of a dial indicator 600 within through opening 422.

A third set of through openings 424 in the calibration tool substrate 402 are used to measure the alignment of the susceptor support arms 330. Each of through openings 424 has a shoulder 425 dividing the through opening into an upper aperture 424a and a lower aperture 424b. The shoulder 425 within opening 424 is planarized in the manner described above and defines the x-y plane of the calibration tool 400. It is important that the plane defined by the proximal end 331 of the support arms be essentially co-planar with the x-y plane of the calibration tool 400. Proper alignment of the support arms 330 assists in ensuring that the susceptor 324 is properly oriented within the inner chamber 302 of the processing unit 300. The co-planarity of the x-y plane defined by support arms 330 with the x-y plane of the calibration tool 400 is measured with the susceptor 324 being removed from the chamber. The planarity of the x-y plane defined by arms 330 is measured by first positioning a dial indicator within at least one of through openings 424 such that the dial indicator rests on shoulder 425 and then measuring the vertical displacement at each support arm 330.

In combination with, or in lieu of measuring the planarity of support arms 330, openings 424 of calibration tool 400 may be used to measure the planarity of the bottom seating surface 326 of the susceptor 324. An additional alignment opening or set of openings may also be provided within the calibration tool substrate 402 for measuring the planarity of the wafer seating surface. Measuring the planarity of the wafer seating surface 326 may be achieved by inserting a dial indicator, or other measuring device within a single alignment opening and rotating the susceptor, preferably one complete rotation. Alternatively, the planarity of the wafer seating surface may be determined by discrete measurements at separate alignment opening locations.

Figure 7:
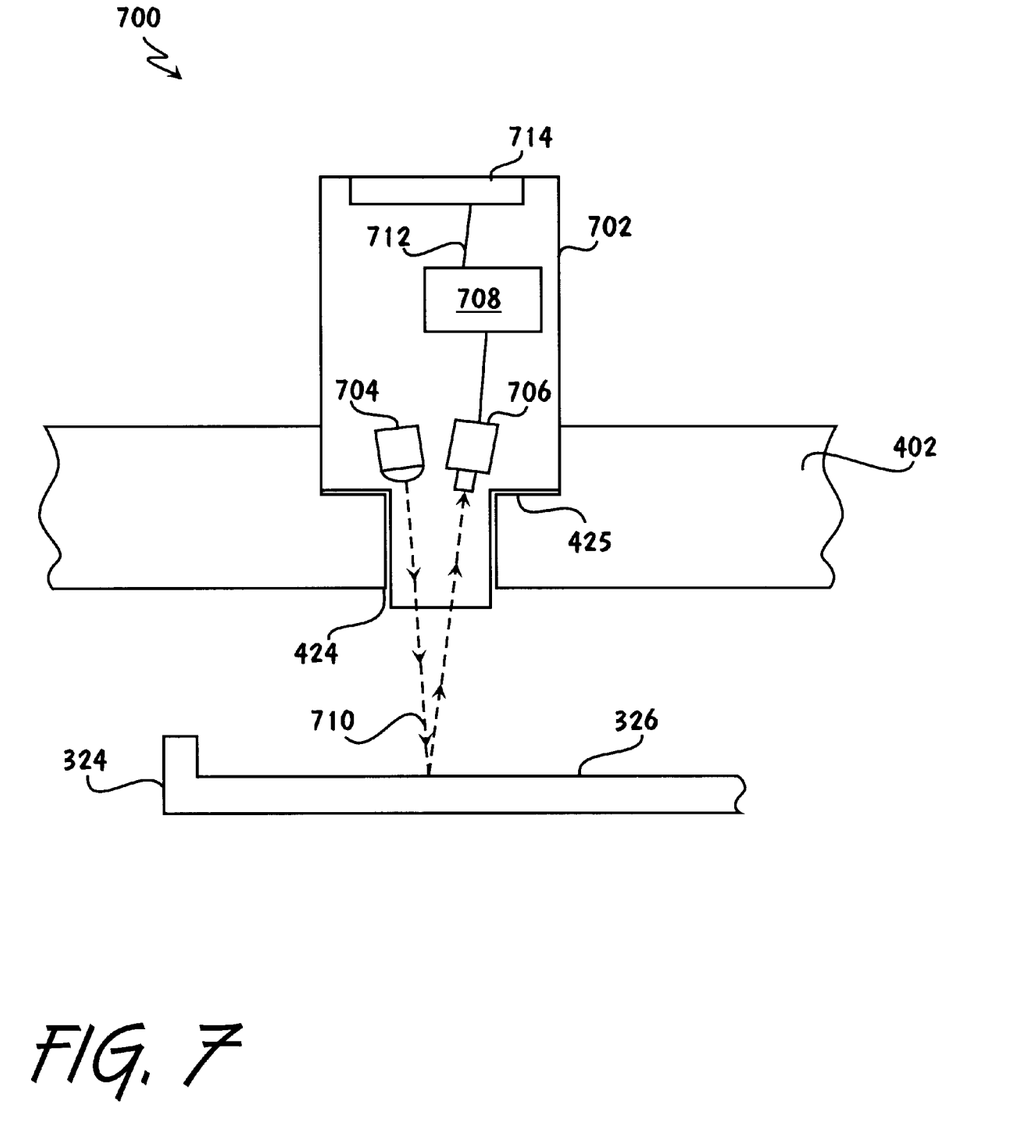
FIG. 7 illustrates an analog measuring tool used to measure the inclination of a susceptor in one embodiment of the present invention.

The inclination and levelness of the wafer seating surface 326 may also be measured using an analog measuring device 700 as shown in FIG. 7. In FIG. 7, the analog measuring device 700 is shown positioned within one of through openings 424 to measure the inclination of the wafer seating surface 326 of susceptor 324. Analog measuring device 700 includes a light transmitter 704 and a light sensor 706 located within a housing 702 configured to be mounted within a calibration tool 400 alignment opening 424. In accordance with one embodiment of the present invention, a light beam 710 is directed onto the seating surface 326 surface of susceptor 324 by light transmitter 704 to produce a target. The light sensor 706 is positioned to observe the target along the seating surface 326. Transmitter 704 is positioned relative to the seating surface to produce a target of a predetermined size and shape when the susceptor is properly aligned in a horizontal position. It is appreciated that the size and shape of the target changes as the angular orientation of the seating surface deviates from a horizontal position. Light sensor 706 observes the light beam target and generates an output signal that is received by a logic circuit 708. Logic circuit 708 generally includes pattern recognition hardware and software that correlates the observations of light sensor 706 into a value or signal 712 that is indicative of the inclination or levelness of the wafer seating surface 326. Signal 712 serves as an input to a display 714 located on the measuring device housing 702. In an alternative embodiment, the control logic 708 and display 714 are located remotely from device 700. In such an embodiment, a cable connection is used to couple the light sensor to the control logic.

Openings 426 and 428 are provided along the outer perimeter of the calibration tool substrate and are used for making side measurements of the susceptor 324. A dial indicator or other measuring device may be inserted into either of openings 426 or 428 to measure the horizontal displacement of the susceptor while the susceptor is being rotated. Any difference in the measured horizontal displacement along the circumference of the susceptor indicates that the rotational axis of the susceptor is not properly aligned within the processing chamber.

In one exemplary embodiment the calibration tool substrate 402 is circular having a diameter of 17.0 inches and a thickness of 2.0 inches. The upper and lower apertures of openings 420, 422 and 424 have a diameter of 1.5 and 1.0 inches, respectively. Openings 426 and 428 are approximately 2 inches square. It is important to note that the geometric shape of substrate 402 and the geometric shape and size of openings 420, 422, 424, 426 and 428 may vary considerably. Additionally, the number and location of the substrate through openings may vary depending upon the particular processing chamber to be calibrated and the specific calibration requirements. In one embodiment, the calibration tool is configured with two or more sets of alignment through openings which permit the calibration tool to be used in the validation of various susceptor assemblies.

Figure 8:
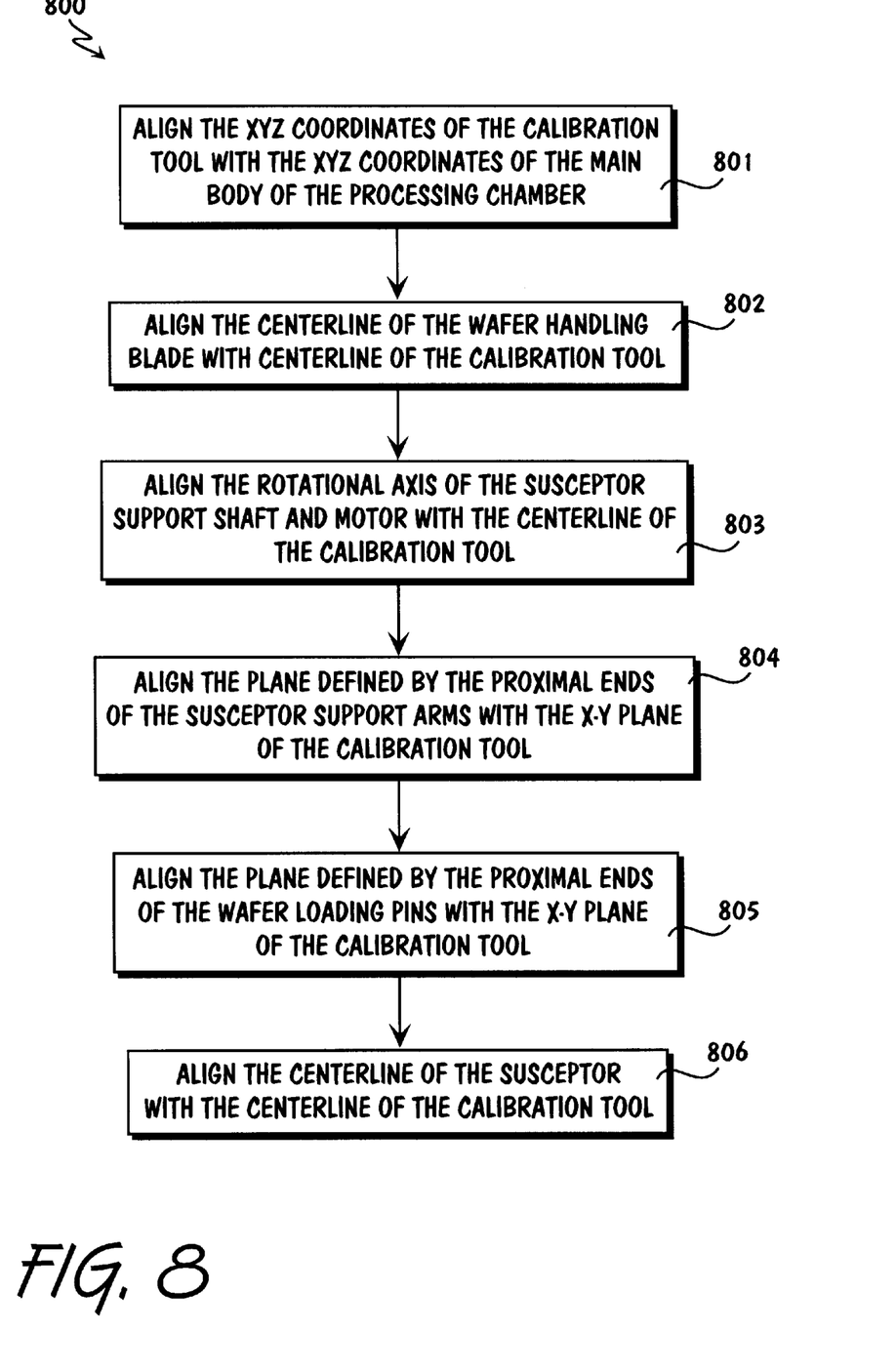
FIG. 8 is a flow chart illustrating one method of calibrating the various components of a semiconductor processing chamber.

In accordance with one embodiment of the invention and illustrated in the flow chart 800 of FIG. 8, calibration of the processing chamber is achieved by first aligning the xyz coordinates of the calibration tool with the xyz coordinates of the main body 304 of the processing chamber (Step 801). In step 802, the centerline of the wafer handling blade is aligned with the centerline of calibration tool 400. In step 803, the rotational axis of the susceptor support shaft 354 and motor 370 are aligned with the centerline of the calibration tool 400. In step 804, the plane defined by the proximal ends 331 of the susceptor support arms 330 is aligned with the x-y plane of the calibration tool 400. In step 805, the plane defined by the proximal ends 341 of the wafer loading pins 342 is aligned with the x-y plane of the calibration tool 400. Lastly, in step 806, the centerline of the susceptor 324 is aligned with the centerline of calibration tool. It is important to note that the present invention is not limited to any particular calibration sequence. Moreover, in some instances it may be desirable to calibrate only a single processing chamber component.

A key advantage of the present invention is that the calibration tool enables the various processing chamber components to be calibrated using a common reference. Accordingly, the present invention enhances the precision to which a semiconductor processing chamber may be calibrated.

In the foregoing description the calibration tool is shown mounted to, and aligned with the main body 304 of the processing chamber 300. The present invention is not limited to such an implementation. It is also important to note that the present invention is not limited to any specific type of processing chamber or wafer handling system, nor is it limited to one type of susceptor design. Moreover, it is appreciated that the relative dimensions, geometric shapes, materials and process techniques set forth within the specification are exemplary of the disclosed embodiments only. Whereas many alterations and modifications to the present invention will no doubt become apparent to a person ordinarily skilled in the art having read the foregoing description, it is to be understood that the particular embodiments shown and described by way of illustration are in no way intended to be limiting. Therefore, reference to the details of the illustrated figures is not intended to limit the scope of the claims which themselves recite only those features regarded as essential to the invention.

What is claimed is:

1. A calibration tool for a semiconductor processing chamber comprising:
   a substrate having a top surface and a bottom surface and a center axis;
   at least three protuberances extending from the bottom surface, each protuberance having a distal end, the distal ends defining a first plane; and
   at least three spring loaded posts extending radially from the substrate.

2. The calibration tool of claim 1 further comprising at least one through opening extending from the top surface to the bottom surface of the substrate.

3. The calibration tool of claim 2 wherein the through opening has a shoulder dividing the through opening into an upper aperture and a lower aperture, the upper aperture having a larger diameter than the lower aperture, the surface of the shoulder lying in a second plane that is substantially co-planar with the first plane.

4. The calibration tool of claim 1 wherein the bottom surface of the substrate has three protuberances spaced 120 degrees apart.

5. The calibration tool of claim 1 wherein the substrate has three spring loaded posts spaced 120 degrees apart.

6. The calibration tool of claim 1 wherein the substrate is circular.

7. The calibration tool of claim 1 further comprising a measuring device positioned on the substrate, the measuring device comprising:

a light transmitter for producing a target;

a light sensor for observing the target; and logic circuit coupled to the light sensor for correlating the observed target to an inclination measurement.

8. The calibration tool of claim 2 wherein the through opening is configured to receive a dial indicator.

\* \* \* \* \*